(12) United States Patent
Yeh (10) Patent No.: US 8,309,391 B2
(45) Date of Patent: Nov. 13, 2012

(54) METHOD FOR MANUFACTURING AN ARRAY-TYPE NANOTUBE LAYER OF A THIN-FILM SOLAR CELL

(76) Inventor: Nan-Hui Yeh, Taipei (TW)

( * ) Notice: Subject to any disclaimer, the term of this patent is extended or adjusted under 35 U.S.C. 154(b) by 137 days.

(21) Appl. No.: 13/032,794

(22) Filed: Feb. 23, 2011

(65) Prior Publication Data

US 2012/0058594 A1 Mar. 8, 2012

(30) Foreign Application Priority Data

Sep. 3, 2010 (TW) ................................ 99129849 A (51) Int. Cl.
*H01L 21/00* (2006.01)
(52) U.S. Cl. ................... 438/88; 438/466; 257/E31.033
(58) Field of Classification Search .............. 438/87–90; 257/E31.033
See application file for complete search history.

(56) References Cited

U.S. PATENT DOCUMENTS

| 2008/0210302 A1* | 9/2008 | Gupta ........................... 136/260 |
| 2009/0101198 A1* | 4/2009 | Yun et al. ...................... 136/252 |

\* cited by examiner

*Primary Examiner* — Richard A. Booth
(74) *Attorney, Agent, or Firm* — Rosenberg, Klein & Lee (57) ABSTRACT

A method for manufacturing an array-type nanotube layer for a thin-film solar cell comprises the steps of: preparing an isotropic Si-substrate; sputtering a metal Ti layer onto the isotropic Si-substrate; heat-treating the Ti-coated Si-substrate in a vacuum heat-treatment environment; annealing the Ti-coated Si-substrate in an annealing heat-treatment environment to produce an intermediate-phase metal Ti layer; anodizing the intermediate-phase metal Ti layer so as to transform the intermediate-phase metal Ti layer into an array-type nanotube layer for the solar cell; and finally applying a reverse voltage to separate the array-type nanotube layer from the isotropic Si-substrate.

11 Claims, 15 Drawing Sheets

METHOD FOR MANUFACTURING AN ARRAY-TYPE NANOTUBE LAYER OF A THIN-FILM SOLAR CELL

This application claims the benefit of Taiwan Patent Application Serial No. 099129849, filed Sep. 3, 2010, the subject matter of which is incorporated herein by reference.

BACKGROUND OF THE INVENTION (1) Field of the Invention

The invention is related to a manufacturing method of a thin-film solar cell, and more particularly to the method for manufacturing an array-type nanotube layer of a thin-film solar cell (2) Description of the Prior Art In the age of energy shortage and conservation and also among the rising concern in environmental protection, renewable energy that is less pollution and recyclable becomes issues to various countries in this planet. According to US energy information administration, energy drain in petroleum, natural gas and coal mine would be true in 41 years, 67 years and 192 years, respectively, since the year of 2003. Also, it is well known that the development of the next-generation energy would focus on solar energy, wind energy, geothermal energy, bio-energy and the like renewable energy.

Among all the aforesaid renewable energies, the solar energy that can be produced without pollutions and maintenance cost is welcome to almost all the countries concerning the energy future, and thus the prosperity of the solar cell products in the marketplace can be foreseen. Nowadays, policing and subsiding for the new-generation energy are two topics that is believed to positively promote the solar energy development.

According to some expert reports, the sun radiates almost $5.4 \times 10^{24}$ joules to the earth every year. On the other hand, the planet consumes $1.1 \times 10^{20}$ joules every year, it is 1/50,000 of the aforesaid solar energy provided by the sun. Therefore, the development of the solar energy can definitely resolve the energy shortage problem of the planet.

In the popular technology of manufacturing the solar cells, the wet-type solar cells are the mainstream products due to their simple manufacturing process and the qualify energy transformation rate (up to 10%). Recently, some efforts have been introducing the nano technique to produce the solar cells. The product solar cells are featured in a huge step forward in both the manufacturing and the physical properties of the solar cells. Thereby, merging the solar cell as one of the consumer packaged goods becomes possible.

In 2001, total solar energy produced in this planet is only 0.1% of the global energy production. Surprisingly, in 2005, global capacity provided by the photovoltaic cells (i.e. solar cells) is up to 2,200 million voltages; equally about 3 billion KW-Hours. It is expected that in 2010 the global photovoltaic market sales will be soared to over 50 billion dollars.

Currently, the solar cells can be classified into five groups: (1) Mono/Polycrystalline solar cells; (2) Amorphous/Thin film solar cells; (3) Inorganic solar cells; (4) Organic solar cells; and (5) Dye-sensitized solar cells (DSSC). Since its first appearance in 1991 of the DSSC by Gratzel, a Swiss scientist, various manufacturing processes for the solar cells have been proposed; such as the TiO2 membrane method, the granular method and the nanotube method.

For example, the Taiwan Patent Application "Spray-coat method for manufacturing broader DSSCs and the DSSCs from the same" with a serial number of 097132538 is one of those efforts in manufacturing the DSSCs. In this application, the broader DSSC includes a substrate forming thereabove a layer of TiO2 nanotubes as an anode of the solar cell, a dye-sensitized material attached to the TiO2 nanotubes, a transparent conductive cathode coated by a Pt nano enzyme layer, and an electrolyte sealed between the anode and the cathode; in which the TiO2 nanotube layer is coated to the substrate by the spray-coat method and a following process in anodizing and heat treatment.

In the aforesaid application, the manufacturing process of the anode of the solar cell comprises: a step of spray-coating a layer of Ti onto the substrate, and a step of anodizing and further heat-treating the Ti layer so as to transform into a nanotube layer of TiO2 as the anode layer of the solar cell. To those ordinary skilled persons in the art, they must understand that the contact area between the dye-sensitized material and the anodized TiO2 layer (including the nanotube portion and the non-nanotube portion) is highly proportionally related to the quantum efficiency (QE) of the solar cell. However, in the disclosure of the aforesaid application, because the substrate is not directional and the spray liquid as well as the spraying process may include impurities that lead to lower the purity of the Ti, so the density of the TiO2 nanotube on the anode layer of the solar cell is hard to achieve a satisfied level. In addition, the TiO2 nanotube is usually shorter than expected.

In order to increase the QE value, it is believed that a new technique toward to increase the density and the length of the TiO2 nanotube on the anode layer of the thin-film solar cell shall be highly welcome; which this new technique is the concern of this application.

SUMMARY OF THE INVENTION

Accordingly, it is the primary object of the present invention to provide a method for manufacturing an array-type nanotube layer of a thin-film solar cell. In the present invention, a unique-directional silicon substrate is introduced to ensure the sputtered metal layer thereon to have a higher density of Ti. Thereby, a plurality of array-type TiO2 nanotubes can be formed on the thin-film solar cell, and also the length of each nanotube can be longer than that of the aforesaid application.

In the present invention, the method for manufacturing an array-type nanotube layer of a thin-film solar cell is firstly to prepare a isotropic silicon substrate (Si-substrate), then to sputter a TiO2 layer onto the isotropic Si-substrate so as to form a Ti-coated Si-substrate, to heat-treat the Ti-coated Si-substrate under a vacuum environment so as to remove possible residual stresses between the metal Ti layer and the Si-substrate, to anneal the Ti-coated Si-substrate under an annealing environment so as to transform the metal Ti layer into an intermediate-phase metal Ti layer, to anodize the intermediate-phase metal Ti layer so as to transform the intermediate-phase metal Ti layer into an array-type nanotube layer for the thin-film solar cell that has thereon a plurality of dense array-type TiO2 nanotubes, and finally to separate the array-type nanotube layer from the isotropic Si-substrate by applying a reverse voltage.

Preferably, in the present invention, the intermediate-phase metal Ti layer is mainly composed of the anatase-phase TiO2 in a crystal structure. The isotropic Si-substrate can be an isotropic Si wafer. A plasma vapor deposition (PVD) process can be used to sputter the metal Ti onto the isotropic Si-substrate. The vacuum environment can be a 0,001-torr environment with a temperature of 920° C. The annealing environment can be a 850° C. environment, and the operation time of the annealing can be 1 hour.

In the present invention, prior to the anodizing process upon the intermediate-phase metal Ti layer, an electrolytic polishing step can be applied to the metal-Ti layer for a cleansing and polishing purpose. Also, in the anodizing process, the intermediate-phase metal Ti layer is immersed into an electrolyte and applied by an operational voltage. Preferably, while in the anodizing process, an electrochemistry DC polarization curve scanning can be carried out in advance to estimate a preferable operational voltage and a preferable pH value of the electrolyte.

Further, in one embodiment of the present invention, the Ti-coated Si-substrate can be a 2 cm×2 cm plate, the preferable operational voltage can be a voltage between 10V and 20V, and the preferable electrolyte can be a solution having a 1.2 vol. % hydrofluoric acid (HF) and a 10 vol. % sulfuric acid ($H_2SO_4$).

By introducing the isotropic Si-substrate and the method for manufacturing the array-type nanotube layer of a thin-film solar cell in accordance with the present invention, the metal Ti layer sputtered onto the substrate can have a higher content of the Ti, and thus a plurality of the longer array-type nanotubes as a laminate form can be successfully formed for future production of the solar cells.

Therefore, the solar cell including the array-type nanotube layer as its anode can provide a broader contact area between the dye-sensitized material and the TiO2 layer to enhance the QE of the solar cell, and can further provide people a reliable and efficient energy source.

All these objects are achieved by the method for manufacturing an array-type nanotube layer of a thin-film solar cell described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a method for manufacturing an array-type nanotube layer of a thin-film solar cell. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

In the present invention, the array-type nanotube layer produced by the manufacturing method in accordance with the present invention can be widely applied to perform as an anode plate for various thin-film solar cells, particularly for the dye-sensitized solar cell (DSSC).

Figure 1:
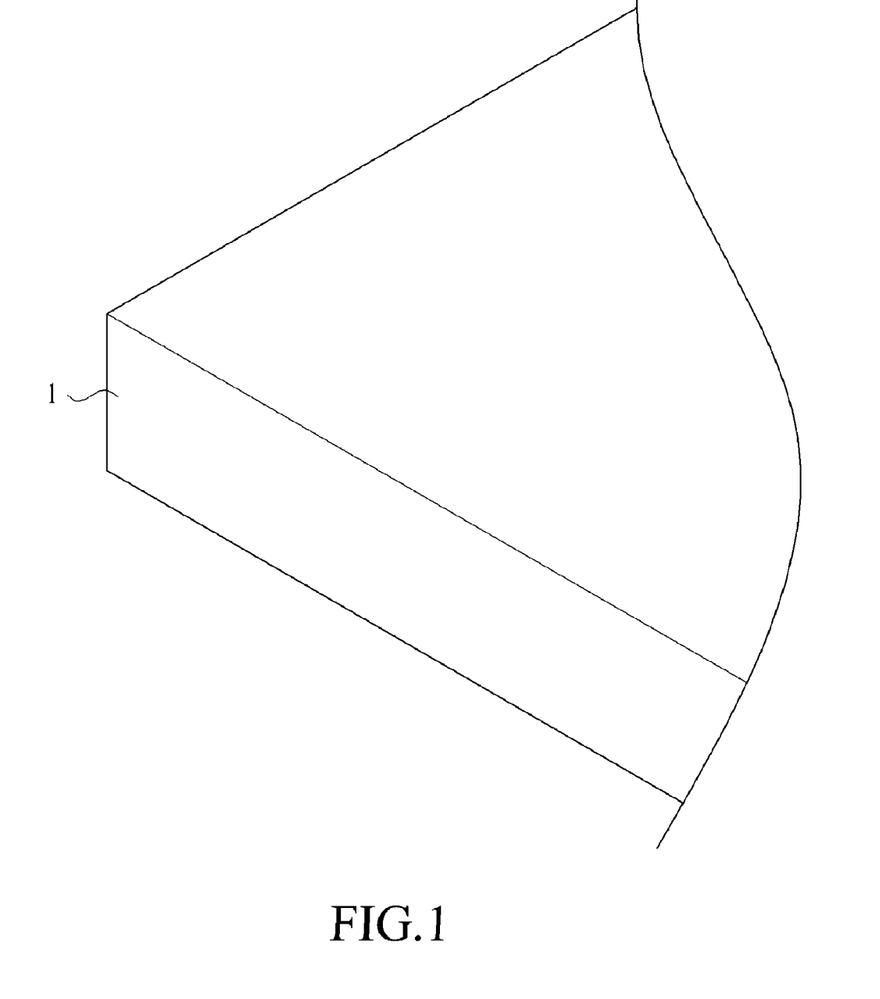
FIG. 1 shows schematically a portion of a typical isotropic Si-substrate.
Figure 2:
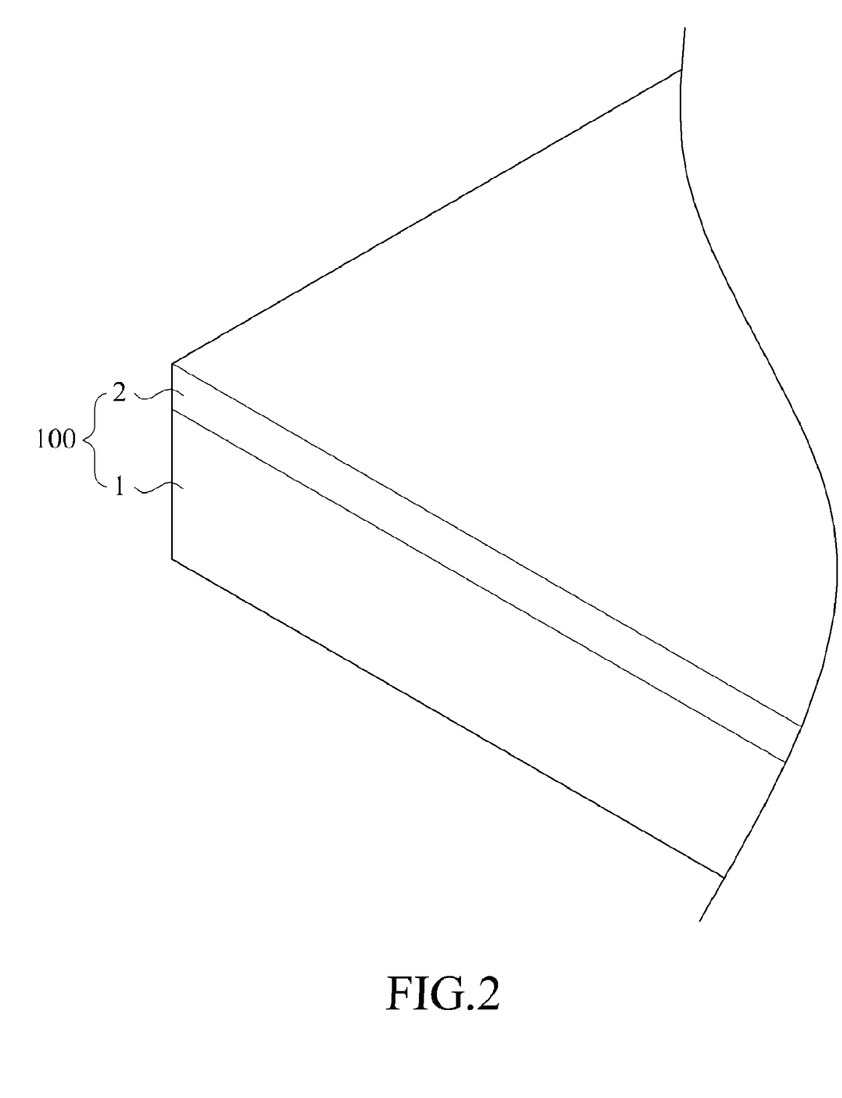
FIG. 2 shows schematically that a layer of Ti metal is formed by a sputtering process on the isotropic Si-substrate of FIG. 1.
Figure 3:
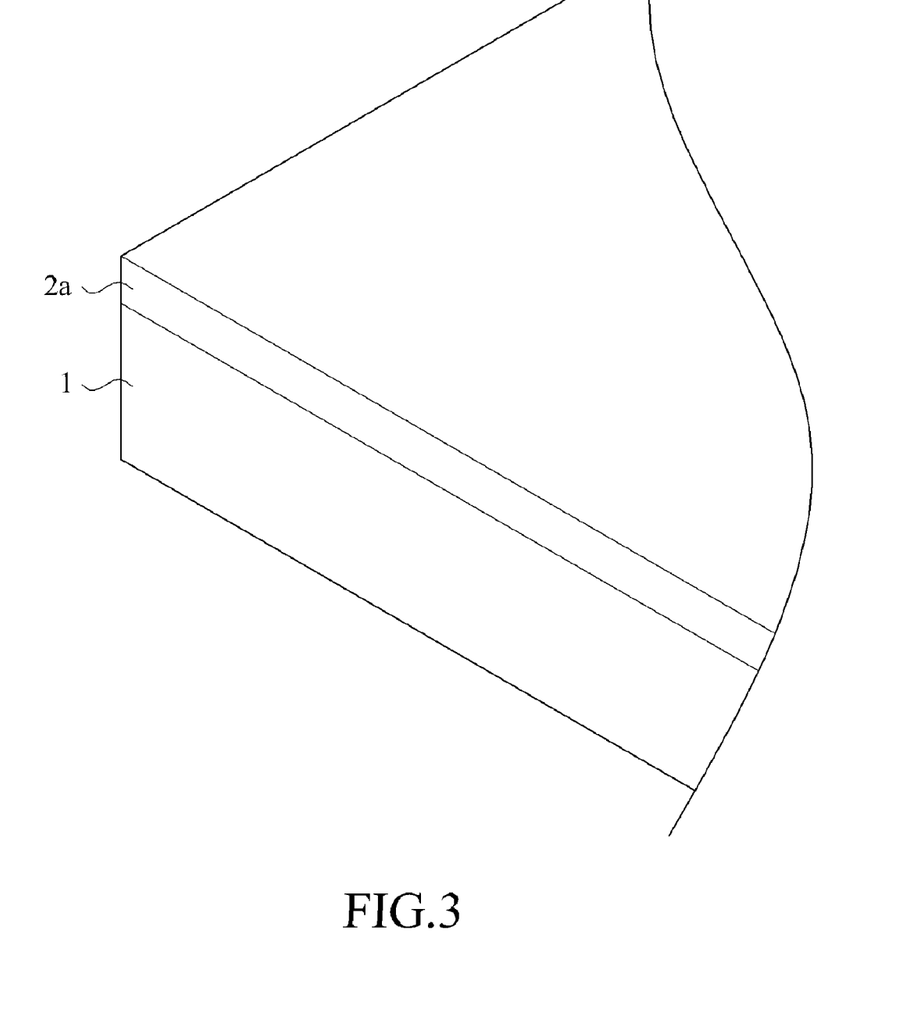
FIG. 3 shows schematically that the metal Ti layer of FIG. 2 is transformed into an intermediate-phase metal Ti layer after an annealing process.

Refer now to FIG. 1 to FIG. 3, in which FIG. 1 shows a portion of a typical isotropic Si-substrate, FIG. 2 shows a metal Ti layer formed on the Si-substrate of FIG. 2 by a sputtering process, and FIG. 3 shows an intermediate-phase metal Ti layer on top of the Si-substrate after an annealing process applied to the combination of FIG. 2. As shown, prior to manufacturing the array-type nanotube layer of the present invention, an isotropic Si-substrate 1 that is featured in unidirectionality of its surface crystal structures is needed. The Si-substrate 1 can be an isotropic silicon wafer or a portion cut from the isotropic silicon wafer.

After the isotropic Si-substrate 1 is ready, a plasma vapor deposition (PVD) equipment can be introduced to perform a sputtering process for coating a metal Ti layer 2 onto the Si-substrate 1. The laminate combination of the metal Ti layer 2 and the Si-substrate 1 is called thereafter as a Ti-coated Si-substrate 100. The Ti-coated Si-substrate 100 is then moved to a vacuum environment for performing a vacuum heat treatment so as to remove possible residual stresses between the metal Ti layer 2 and the isotropic Si-substrate 1 and thus to ensure the lamination in between. In the vacuum environment, the pressure can be 0.001 torr and the temperature can be 920° C.

Then, an annealing process in an annealing treatment environment is performed to the Ti-coated Si-substrate 100 so as to transform the metal Ti layer 2 into an intermediate-phase metal Ti layer 2a. Preferably, the annealing treatment environment can have a temperature of 850° C. for lasting about 1 hour. Here, the intermediate-phase metal Ti layer 2a contains mainly the crystal structure of the anatase-phase TiO2.

After completing the annealing process upon the Ti-coated Si-substrate 100, an electrolytic polishing process can be introduced to clean and polish the intermediate-phase metal Ti layer 2a. In the electrolyte polishing, the Ti-coated Si-substrate 100 is arranged at the anode end, while the cathode end is a Pt pole. The chemical reaction is performed in a proper electrolyte. With relevant setting of operation parameters, the surface of the intermediate-phase metal Ti layer 2a can be dissolved due to an electric fielding effect and thus the surface of the intermediate-phase metal Ti layer 2a can be smooth and shining.

In the electrolyte polishing, the electrolyte can contain a perchloric acid (HClO4), an ethylene monobutyl-ether (HOCH2CH2OC4H9) and methanol (CH3OH). The temperature of the electrolyte can be 15° C., and the work voltage can be 50V for lasting a minute and then 28V for lasting about 13 minutes.

Then, an anodizing process can be applied to the intermediate-phase metal Ti layer 2a. In this process, the Ti-coated Si-substrate 100 is immersed into an electrolyte and crossed a work voltage. Preferably, prior to the anodizing process, an electrochemistry DC polarization curve scanning (EDCPCS) can be performed to estimate an optimal work voltage and an optimal pH value for the electrolyte for carrying out the anodizing process.

In one embodiment of the present invention, the Ti-coated Si-substrate 100 is a plate that has a 2 cm×2 cm surface area. According to the EDCPCS, the optimal range of the work voltage is 10V-20V, preferable 15V, and the optimal electrolyte can be a solution having a 1.2 vol. % hydrofluoric acid (HF) and a 10 vol. % sulfuric acid ($H_2SO_4$).

Figure 4:
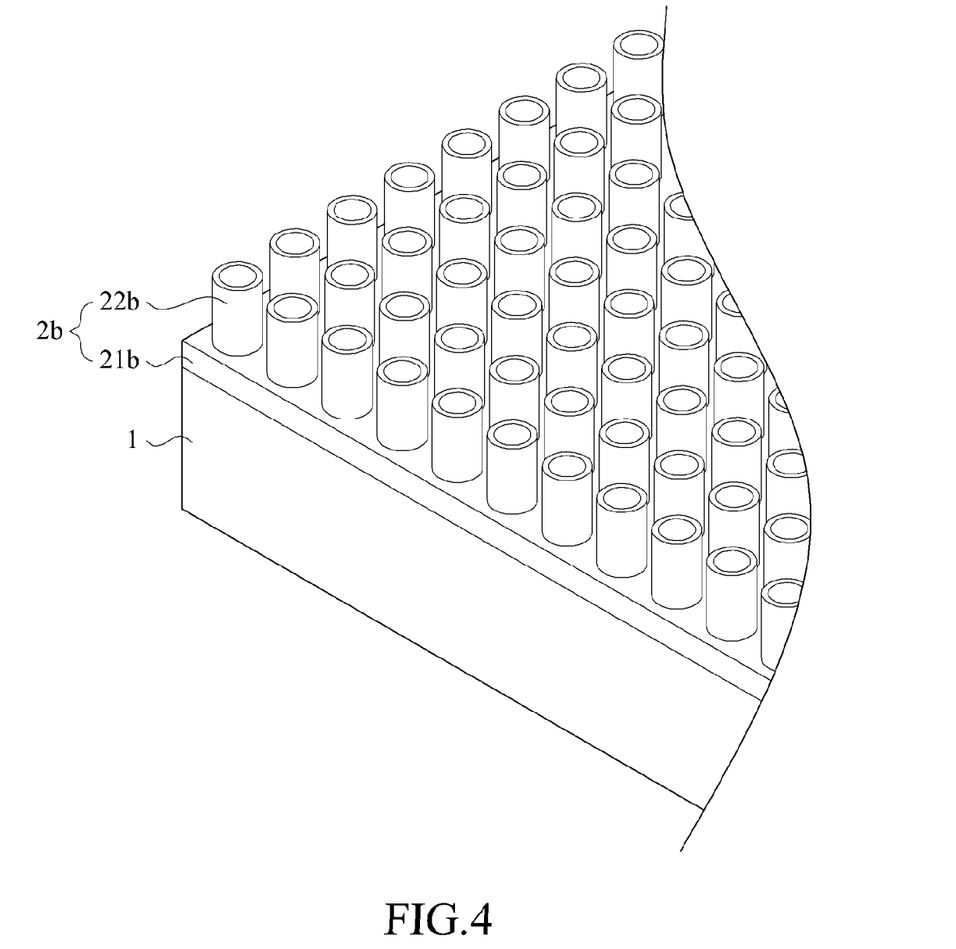
FIG. 4 shows schematically that the intermediate-phase metal Ti layer of FIG. 3 is transformed into an array-type nanotube layer for a thin-film solar cell after an anodizing process.

Refer now to FIG. 4 and FIGS. 5A-5G. FIG. 4 shows schematically that the intermediate-phase metal Ti layer 2a of FIG. 3 is transformed into an array-type nanotube layer 2b for a thin-film solar cell on the Si-substrate 1 after the anodizing process. On the other hand, FIG. 5A-FIG. 5G illustrate various microscopic images, under an electron microscope, of respective array-type nanotube layers 2b formed by applying different work/operational voltages. As shown in FIG. 4, the array-type nanotube layer 2b is transformed from the intermediate-phase metal Ti layer 2a of FIG. 3 by the aforesaid anodizing process. In the present invention, the array-type nanotube layer 2b includes a base $TiO_2$ layer 21b and a plurality of $TiO_2$ nanotubes 22b standing on the base $TiO_2$ layer 21b in a concentrated array manner.

Figure 5A:
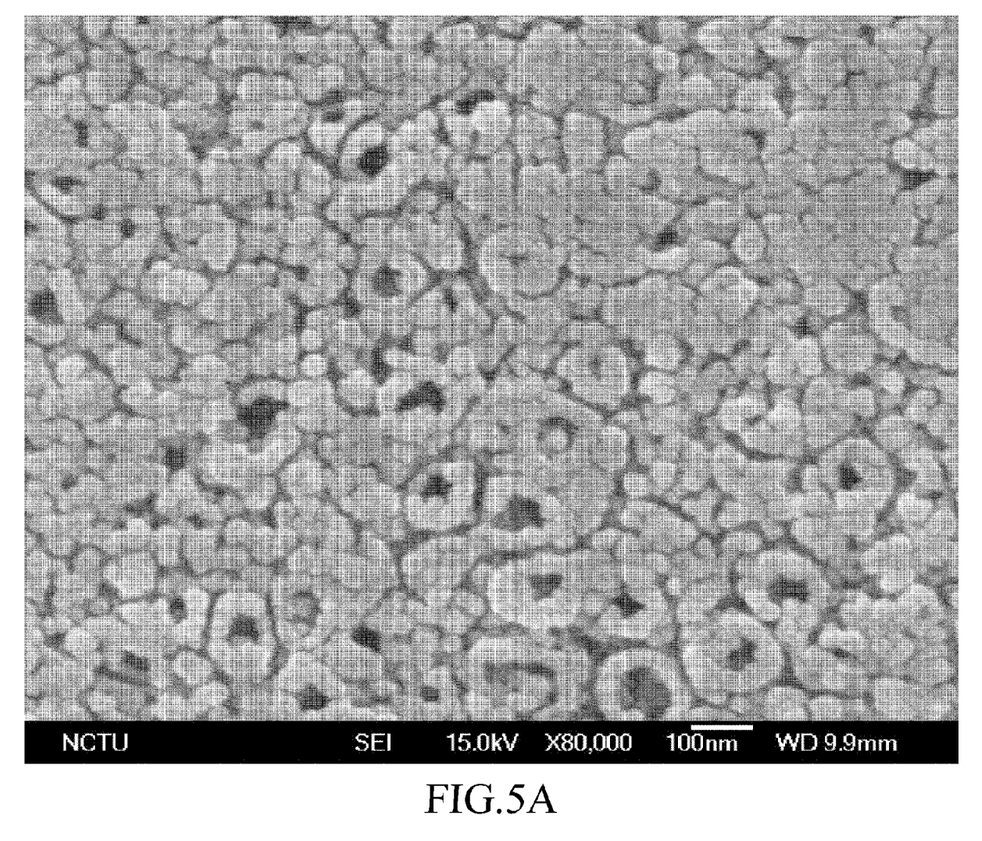
FIG. 5A-FIG. 5G illustrate various microscopic images, under an electron microscope, of array-type nanotube layers formed by applying different operational voltages.

In FIG. 5A, the microscopic image (×80,000) of the array-type nanotube layer 2b is formed by applying a 10V work voltage to the intermediate-phase metal Ti layer 2a. As shown, some $TiO_2$ nanotubes are formed in this viewing window.

Figure 5B:
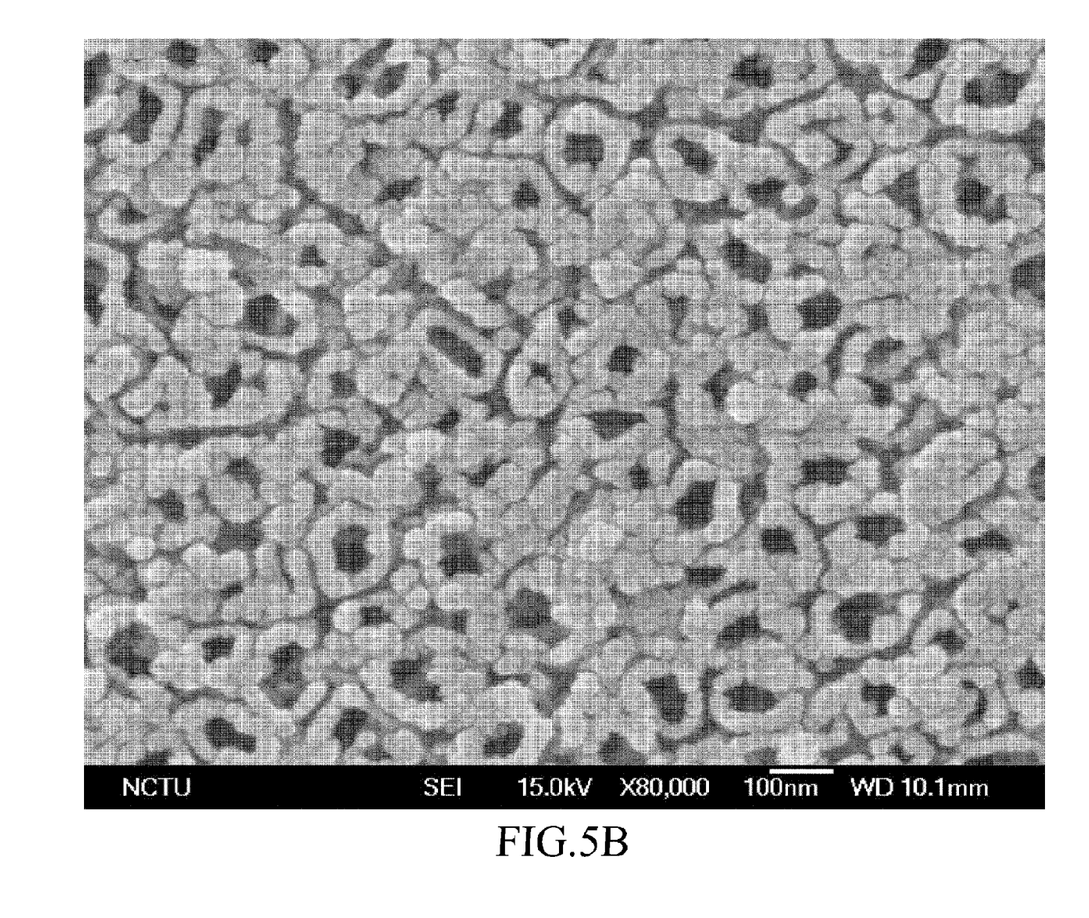

In FIG. 5B, the microscopic image (×80,000) of the array-type nanotube layer 2b is formed by applying a 12V work voltage to the intermediate-phase metal Ti layer 2a. As shown, more $TiO_2$ nanotubes than those of FIG. 5A are formed in this viewing window.

Figure 5C:
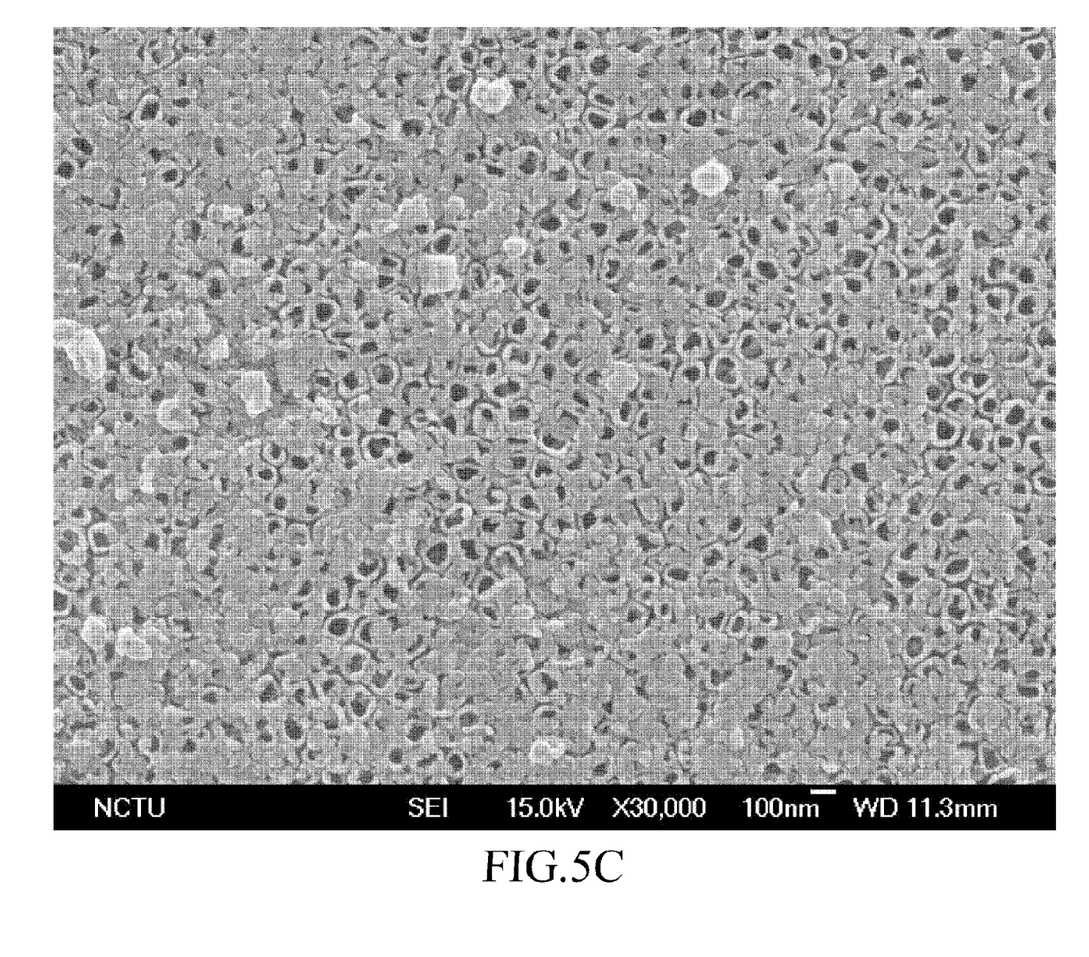

In FIG. 5C, the microscopic image (×30,000) of the array-type nanotube layer 2b is formed by applying a 13V work voltage to the intermediate-phase metal Ti layer 2a. As shown, the number of the $TiO_2$ nanotubes within a specific area is increased as the work voltage raised from 10V to 13V.

Figure 5D:
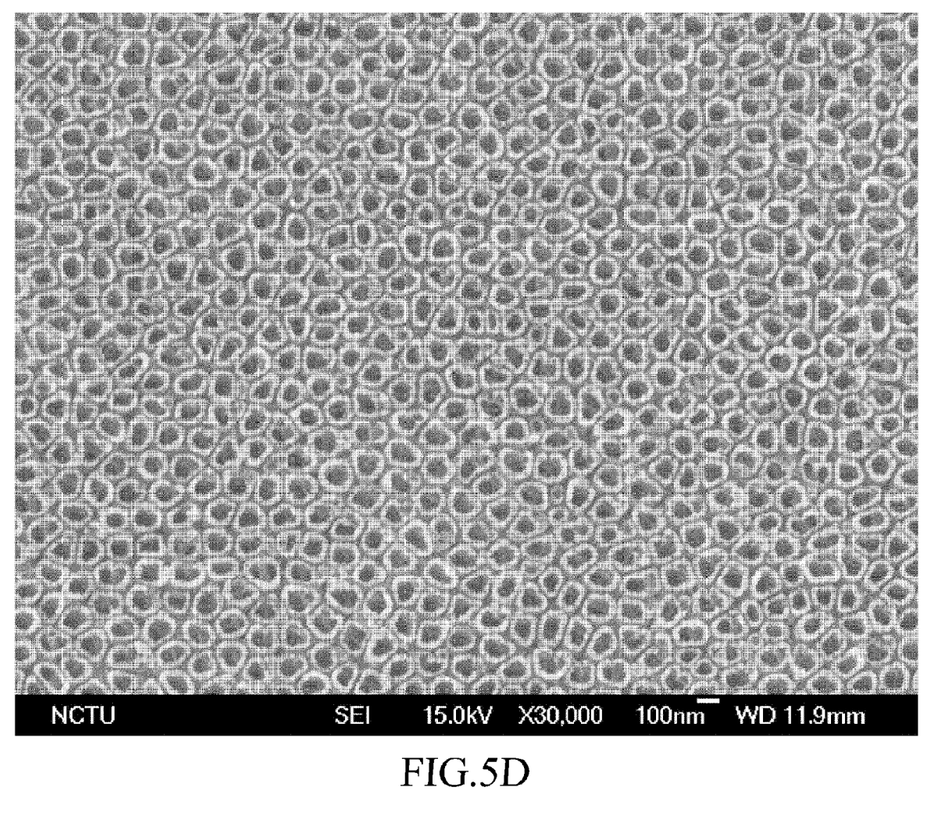

In FIG. 5D, the microscopic image (×30,000) of the array-type nanotube layer 2b is formed by applying a 15V work voltage to the intermediate-phase metal Ti layer 2a. As shown, the $TiO_2$ nanotubes within this specific area are arranged in a perfect concentrated manner than those shown before, from FIG. 5A to FIG. 5C.

Figure 5E:
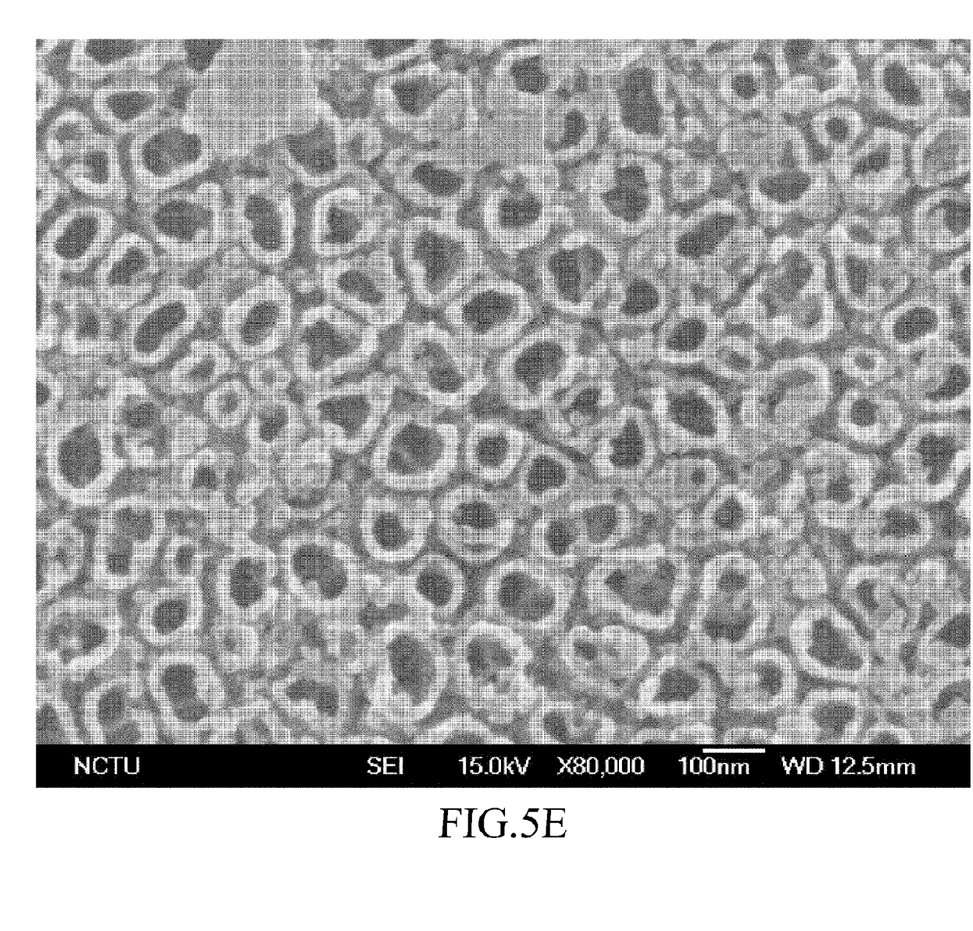

In FIG. 5E, the microscopic image (×80,000) of the array-type nanotube layer 2b is formed by applying a 16V work voltage to the intermediate-phase metal Ti layer 2a. It is seen that some of the nanotubes have presented a little breakdown appearance as the work voltage is raised from 15V to 16V.

Figure 5F:
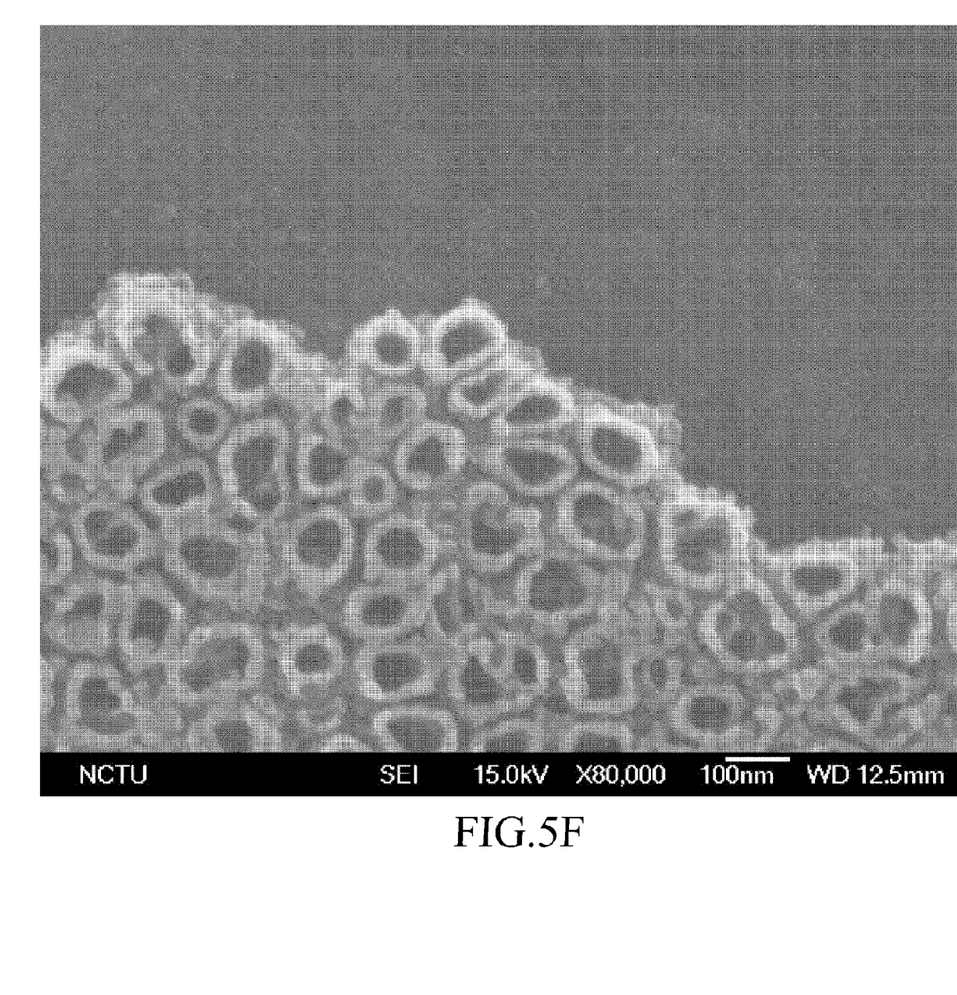

In FIG. 5F, the microscopic image (×80,000) of the array-type nanotube layer 2b is formed by applying a 18V work voltage to the intermediate-phase metal Ti layer 2a. It is seen that breakdown nanotubes are increased and also some of those are presented a distorted appearance 16V.

Figure 5G:
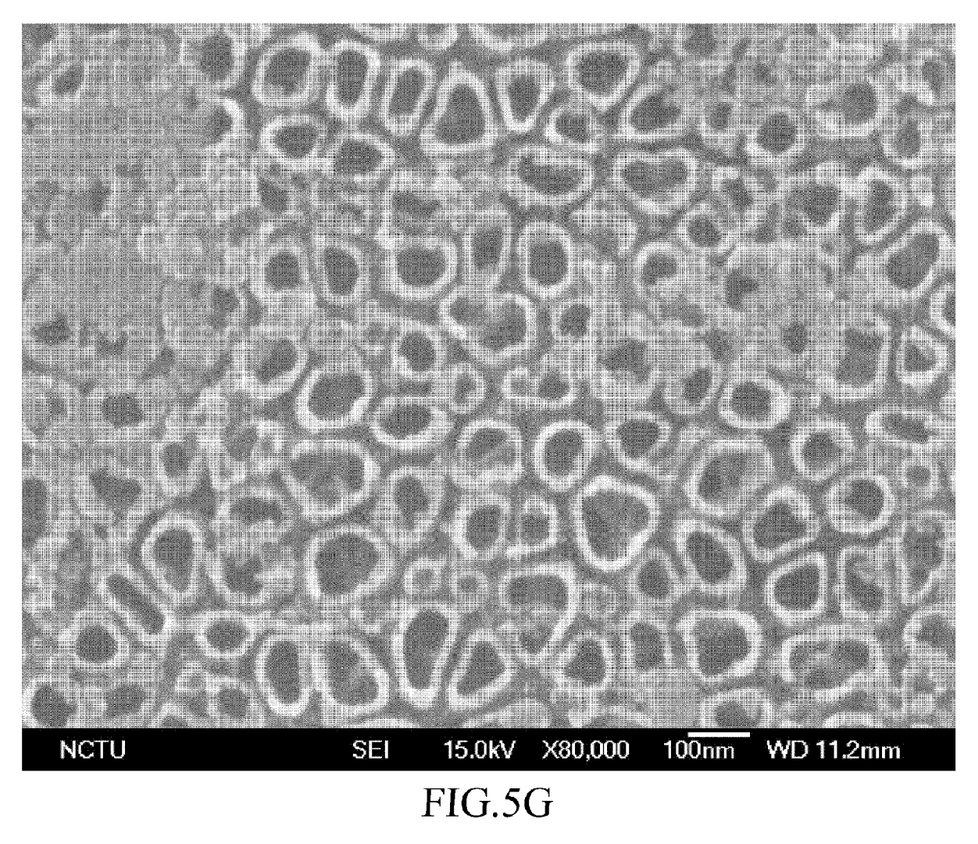

In FIG. 5G, the microscopic image (×80,000) of the array-type nanotube layer 2b is formed by applying a 20V work voltage to the intermediate-phase metal Ti layer 2a. It is seen that both the breakdown and the distortion phenomena are worse as the work voltage is increased further. Moreover, some depositions are shown to be accumulated on tops of some nanotubes. It is then proved that the optimal work voltage for the 2 cm×2 cm Ti-coated Si-substrate 100 is about 15V.

Figure 6:
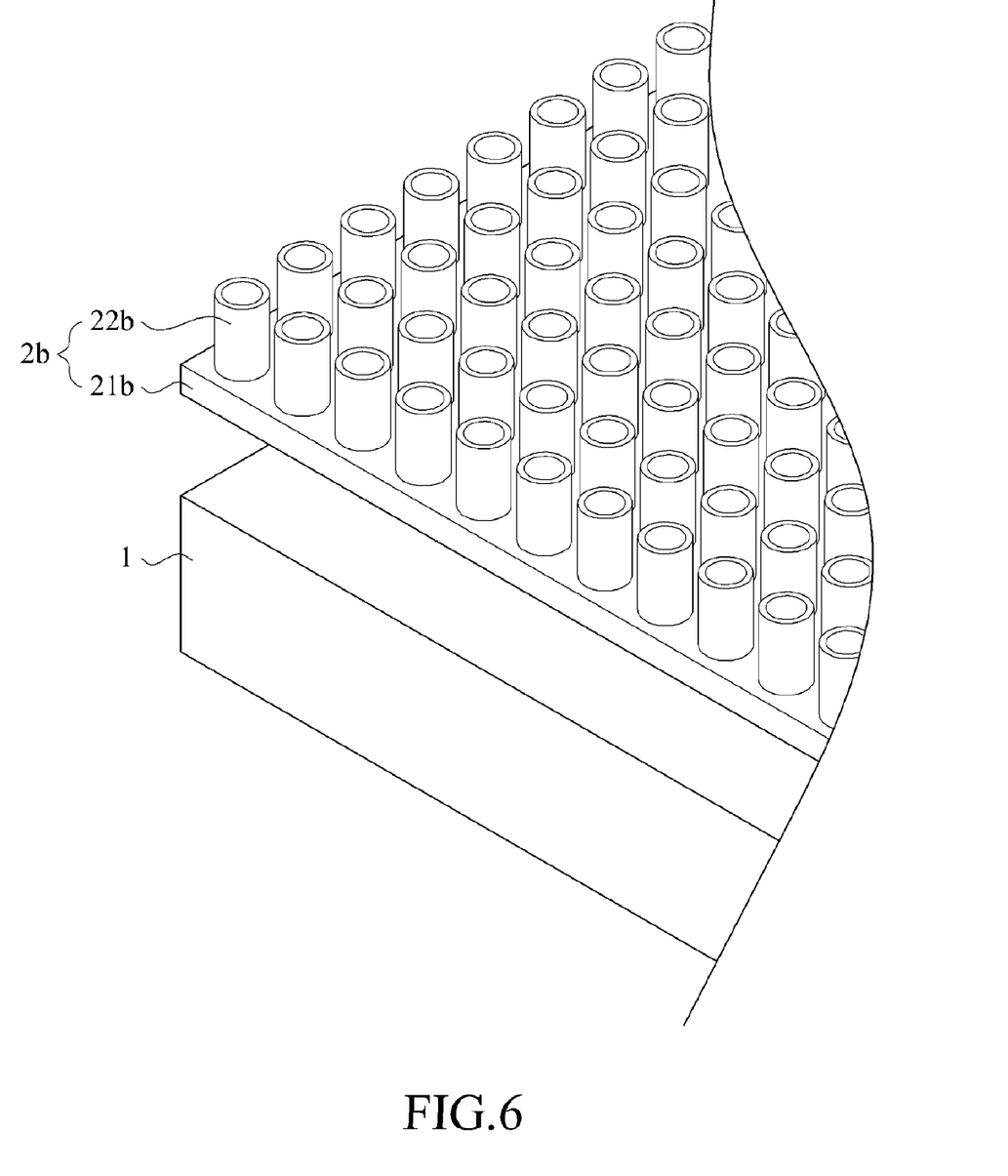
FIG. 6 shows schematically that the array-type nanotube layer of FIG. 4 is separated from the isotropic Si-substrate after applying a reverse voltage.

Referring now to FIG. 6, it is shown that the array-type nanotube layer 2b of FIG. 4 is separated from the isotropic Si-substrate 1 after applying a reverse voltage. The reverse voltage is reversed to the work voltage for the anodizing process. By applying this reverse voltage, the array-type nanotube layer 2b can be separated from the isotropic Si-substrate 1.

Figure 7:
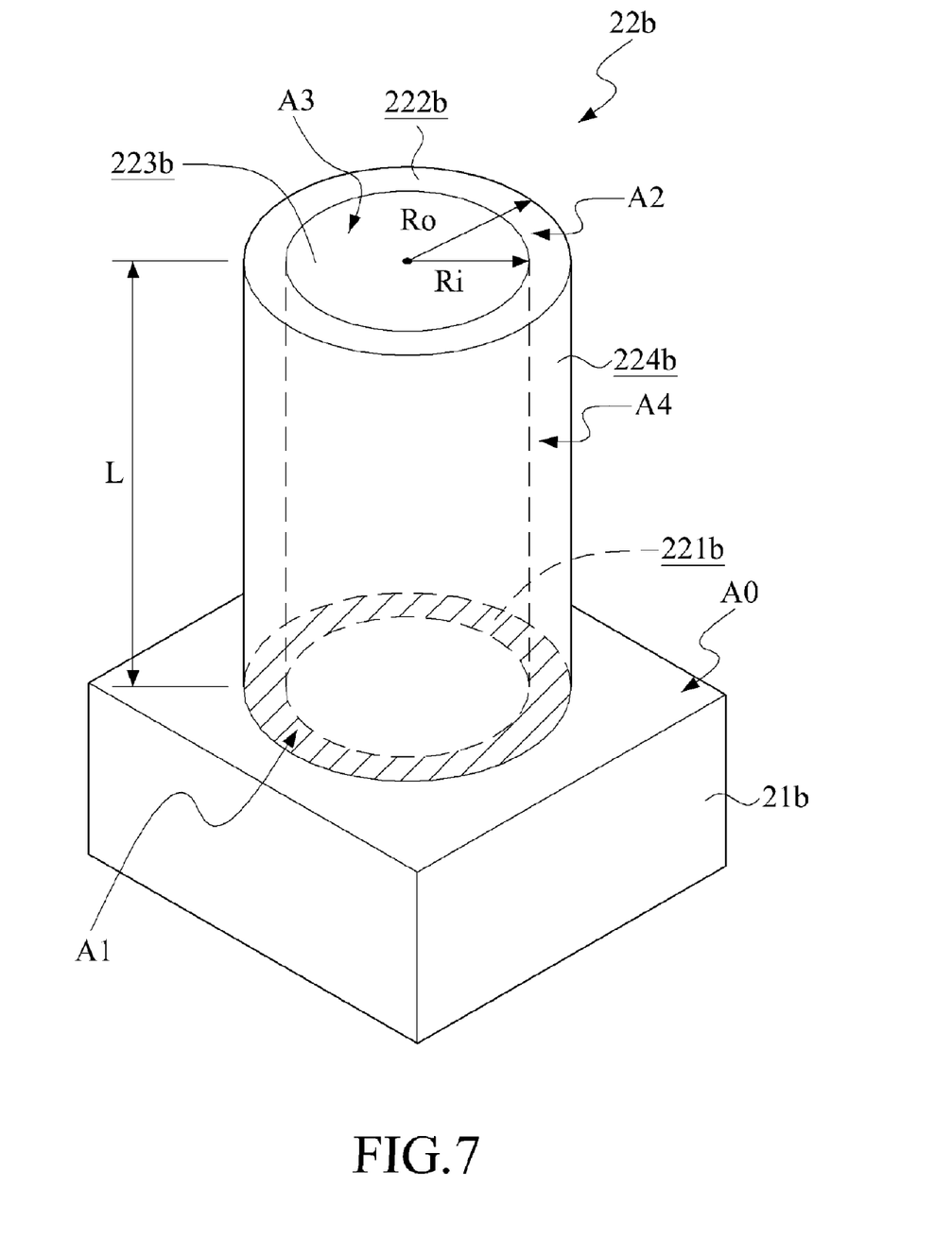
FIG. 7 is a schematic perspective view of a typical TiO2 nanotube in accordance with the present invention.

Referring now to FIG. 7, a schematic perspective view of a typical $TiO_2$ nanotube in accordance with the present invention is shown. As mentioned above in FIG. 6, the array-type nanotube layer 2b includes the base $TiO_2$ layer 21b and a plurality of the $TiO_2$ nanotubes 22b standing on the base $TiO_2$ layer 21b in a concentrated array manner. As shown in FIG. 7, it is illustrated that each of the nanotubes 22b occupies a unit occupation area (A0) on the base $TiO_2$ layer 21b. The $TiO_2$ nanotube 22b has an inner diameter Ri, an outer diameter Ro and a tube length L. Further, the $TiO_2$ nanotube 22b has a bottom surface 221b with an area A1, a top surface 222b with an area A2, an inner wall 223b with an area A3 and an outer wall 224b with an area A4. For the $TiO_2$ nanotube 22b is grown from the base $TiO_2$ layer 21b, so an instinct unique piece is made between the base $TiO_2$ layer 21b and the Ti nanotube 22b. Thus, the bottom surface 221b is sealed inside the nanotube 22b, and only the top surface 222b, the inner wall 223b and the outer wall 224b are exposed to the atmosphere and can contact with the dye-sensitized material in the following application of the thin-film solar cell.

In the application of the array-type nanotube layer 2 to the thin-film solar cell, the total surface area applicable to contact with the dye-sensitized material of a unit nanotube 22b as shown in FIG. 7 is the area of A0+A3+A4, by comparing to the area A0 of the same unit layer without the nanotube 22b. That is to say that, by including the nanotube structure of the present invention, the efficient area of the $TiO_2$ as the anode of the solar cell, for contacting the dye-sensitized material as the cathode, can be increased by $2 \times \pi \times Ri \times L(A3) + 2 \times \pi \times Ro \times L(A4)$.

In the present, it can be foreseen that a smaller A0 and a larger L (a denser population of the nanotubes within a specific area of the base $TiO_2$ layer) would contribute more in extending the contact area between the anode and the cathode of the thin-film solar cell, which implies better electricity performance of the solar cell can be obtained.

According to the aforesaid EDCPS results of the typical embodiment, it is further known that the average length of the nanotube of FIG. 5A is about 2.52 μm, that of FIG. 5D is 5.4 μm, and that of FIG. 5G is 6.12 μm. However, in the previous discussion, it is understood that majority of the nanotubes of FIG. 5G (under a 20V work voltage) faces the problem of breakdown, distortion and unexpected deposition. Therefore, it is concluded that the optimal work voltage for anodizing the intermediate-phase metal Ti layer is about 15V.

By comparing the results of the present invention to those of the aforesaid cited Taiwan patent application, it is estimated from FIG. 5A of the cited application that the number of $TiO_2$ nanotubes within a surface of 500 nm×500 nm is about 36 and the A0 for rising a single nanotube is about 7,000 nm2. On the other hand, in the present invention, it is counted from FIG. 5D of the cited application that the number of $TiO_2$ nanotubes within a surface of 500 nm×500 nm is about 43-45 and the A0 for rising a single nanotube is about 5,600-5,800 nm2.

Apparently, the present invention is superior to the cited application in structuring the $TiO_2$ nanotube layer for the thin-film solar cell. According to the previous analysis, the unit occupation surface area A0 of the present invention is about 80% of that of the cited application. Namely, in producing the array-type $TiO_2$ nanotube layer 2b for the thin-film solar cell, the method provided by the present invention can formulate a denser structure of the $TiO_2$ nanotube arrangement than the cited application can do.

In addition, many efforts have shown that higher isotropic degree in the metal Ti layer would lead to form longer nanotubes after the anodizing process. In the cited application, for the metal Ti layer is formed by a spray-coating process, the Ti crystals are opt to present an irregular formulation. Thereby, the nanotubes therefrom may present various lengths (mostly shorter) and different directions. On the other hand, for the isotropic Si-substrate 1 and the sputtering process to form the metal Ti layer 2 are introduced in accordance with the present invention, the nanotudes produced from the invented method can have longer lengths and better directionality.

In summary of the comparison between the cited application and the present invention, it is obvious that the thin-film solar cell utilizing the array-type nanotube layer of the present invention would provide more contact area between the nanotube layer (anode) and the dye-sensitized material (cathode), and thus would present a better QE value.

Figure 8A:
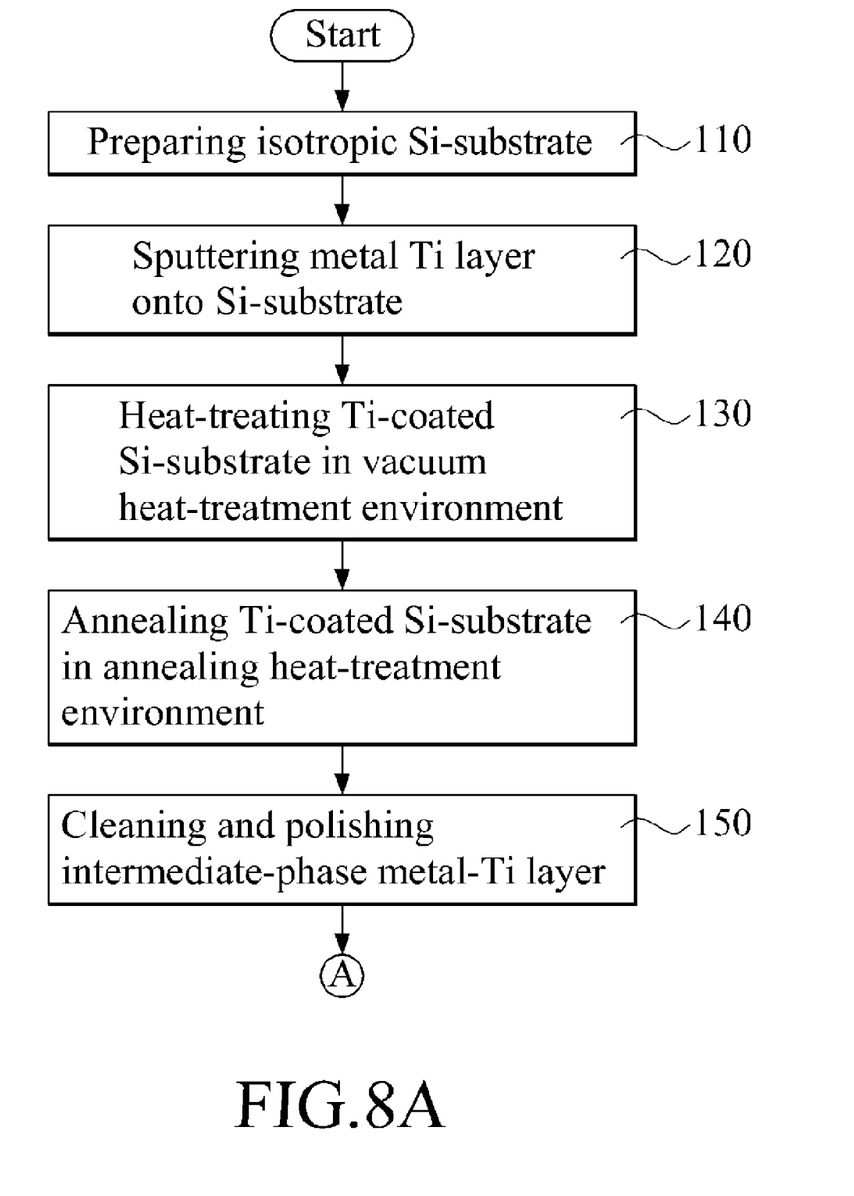
FIG. 8A and FIG. 8B illustrate continually a flowchart of a preferable method for manufacturing an array-type nanotube layer of a thin-film solar cell in accordance with the present invention.
Figure 8B:
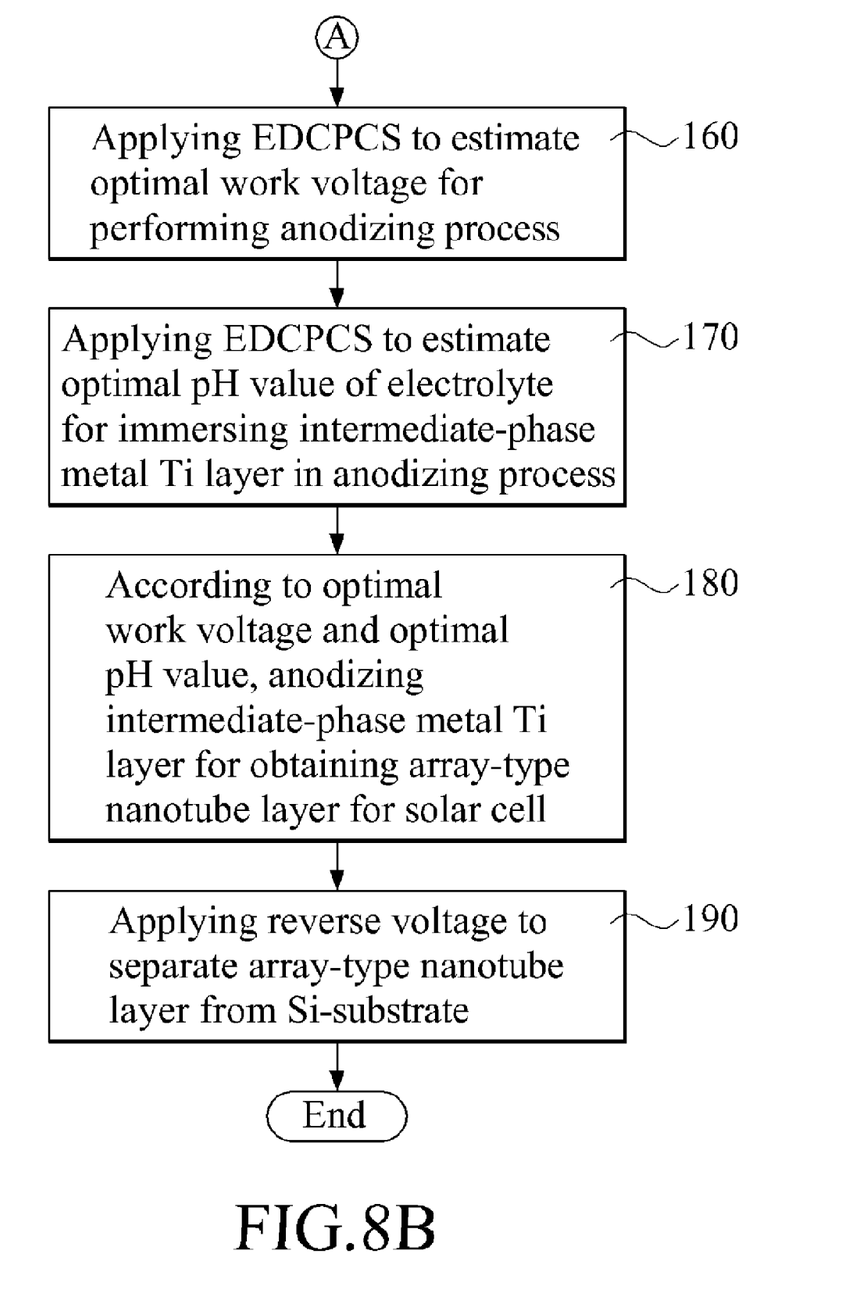

Referring now to FIG. 8A and FIG. 8B, a continuous flowchart of a preferable method for manufacturing an array-type nanotube layer of a thin-film solar cell in accordance with the present invention is shown. The method comprises steps of: preparing an isotropic Si-substrate (Step 110); sputtering a metal Ti layer onto the isotropic Si-substrate so as to form a unique Ti-coated Si-substrate (Step 120); heat-treating the Ti-coated Si-substrate in a proper vacuum heat-treatment environment so as to remove possible residual stresses between the metal Ti layer and the isotropic Si-substrate (Step 130); annealing the Ti-coated Si-substrate in an annealing heat-treatment environment so as to transform the metal Ti layer into an intermediate-phase metal Ti layer (Step 140); cleaning and polishing the intermediate-phase metal-Ti layer by an electrolyte polishing process (Step 150); in the electrolyte polishing process, applying an EDCPCS method to estimate an optimal work voltage for performing the anodizing process upon the intermediate-phase metal Ti layer (Step 160); meanwhile, applying the EDCPCS method to estimate an optimal pH value of the electrolyte for immersing the intermediate-phase metal Ti layer in the anodizing process (Step 170); according to the optimal work voltage and the optimal pH value of the electrolyte, anodizing the intermediate-phase metal Ti layer so as to transform into an array-type nanotube layer for the solar cell that includes a plurality of TiO2 nanotubes (Step 180); and finally applying a reverse voltage to separate the array-type nanotube layer from the isotropic Si-substrate, in which the array-type nanotube layer can be moved to act as an anode plate for a dye-sensitized solar cell (Step 190).

By introducing the isotropic Si-substrate and the method for manufacturing the array-type nanotube layer of a thin-film solar cell in accordance with the present invention, it is already proved by both experiments and quality analysis that the metal Ti layer sputtered onto the Si-substrate can have a higher content of the Ti, and thus a plurality of the longer and denser array-type nanotubes as a laminate form can be successfully formed for future production of the solar cells.

Therefore, the solar cell including the array-type nanotube layer as its anode plate can provide a broader contact area between the dye-sensitized material (as the cathode) and the TiO2 layer to enhance the QE of the solar cell, and can further provide people a reliable and efficient energy source.

While the present invention has been particularly shown and described with reference to a preferred embodiment, it will be understood by those skilled in the art that various changes in form and detail may be without departing from the spirit and scope of the present invention.

I claim:

1. A method for manufacturing an array-type nanotube layer for a thin-film solar cell, comprising the steps of:
   (a) preparing an isotropic Si-substrate;
   (b) sputtering a metal Ti layer onto the isotropic Si-substrate so as to form a unique Ti-coated Si-substrate;
   (c) heat-treating the Ti-coated Si-substrate in a vacuum heat-treatment environment so as to remove possible residual stresses between the metal Ti layer and the isotropic Si-substrate;
   (d) annealing the Ti-coated Si-substrate in an annealing heat-treatment environment so as to transform the metal Ti layer into an intermediate-phase metal Ti layer;
   (e) anodizing the intermediate-phase metal Ti layer so as to transform the intermediate-phase metal Ti layer into an array-type nanotube layer for the solar cell, wherein the array-type nanotube layer includes a plurality of TiO2 nanotubes arranged in a dense array-type manner; and
   (f) applying a reverse voltage to separate the array-type nanotube layer from the isotropic Si-substrate.

2. The method for manufacturing an array-type nanotube layer for a thin-film solar cell according to claim 1, wherein said isotropic Si-substrate is an isotropic silicon wafer.

3. The method for manufacturing an array-type nanotube layer for a thin-film solar cell according to claim 1, wherein said intermediate-phase metal Ti layer contains mainly TiO2 crystals in an anatase phase.

4. The method for manufacturing an array-type nanotube layer for a thin-film solar cell according to claim 1, wherein said step (b) is performed by a plasma vapor deposition equipment.

5. The method for manufacturing an array-type nanotube layer for a thin-film solar cell according to claim 1, wherein said vacuum heat-treatment environment in said step (c) has a pressure of 0.01 torr and a temperature of 920° C.

6. The method for manufacturing an array-type nanotube layer for a thin-film solar cell according to claim 5, wherein said annealing heat-treatment environment of said step (d) has a temperature of 850° C. and an operation duration of 1 hour.

7. The method for manufacturing an array-type nanotube layer for a thin-film solar cell according to claim 1, prior to said step (e), further including a step (e0) of cleaning and polishing said intermediate-phase metal Ti layer.

8. The method for manufacturing an array-type nanotube layer for a thin-film solar cell according to claim 7, wherein said step (e0) is performed by an electrolyte polishing process.

9. The method for manufacturing an array-type nanotube layer for a thin-film solar cell according to claim 1, wherein said step (e) is performed by immersing said intermediate-phase metal Ti layer into an electrolyte and further being across by a work voltage.

10. The method for manufacturing an array-type nanotube layer for a thin-film solar cell according to claim 9, wherein said step (e) further includes a step (e1) of applying an electrochemistry DC polarization curve scanning (EDCPCS) process to estimate an optimal work voltage and an optimal pH value for said electrolyte.

11. The method for manufacturing an array-type nanotube layer for a thin-film solar cell according to claim 10, wherein said Si-substrate has an area of 2 cm×2 cm, said optimal work voltage is ranged between 10V and 20V, and said electrolyte includes a hydrofluoric acid (HF) of 1.2 vol. % and a sulfuric acid ($H_2SO_4$) of 10 vol. %.

* * * * *